US008805635B2

(12) United States Patent
Parker (10) Patent No.: US 8,805,635 B2
(45) Date of Patent: Aug. 12, 2014

(54) SYSTEMS AND METHODS FOR REMOTE ELECTRONICS DEVICE TESTING

(75) Inventor: Scott Parker, Aurora, CO (US)

(73) Assignee: EchoStar Technologies L.L.C., Englewood, CO (US)

( * ) Notice: Subject to any disclaimer, the term of this patent is extended or adjusted under 35 U.S.C. 154(b) by 751 days.

(21) Appl. No.: 12/486,685

(22) Filed: Jun. 17, 2009

(65) Prior Publication Data

US 2010/0324855 A1    Dec. 23, 2010

(51) Int. Cl.
| | | |
|---|---|---|
| *G01R 31/00* | (2006.01) | |
| *G06F 19/00* | (2011.01) | |
| *G01R 31/28* | (2006.01) | |
| *G06F 11/00* | (2006.01) | |

(52) U.S. Cl.
USPC .............. 702/119; 702/183; 714/724; 714/57

(58) Field of Classification Search
USPC .......... 702/119, 117, 122, 123, 188; 715/700, 715/764, 760; 714/724, 57
See application file for complete search history.

(56) References Cited

U.S. PATENT DOCUMENTS

| | | | | |
|---|---|---|---|---|
| 7,260,597 | B1* | 8/2007 | Hofrichter et al. | 709/200 |
| 7,308,492 | B2* | 12/2007 | Konopka et al. | 709/221 |
| 7,519,861 | B2* | 4/2009 | Mayer et al. | 714/28 |
| 2002/0093356 | A1* | 7/2002 | Williams et al. | 324/765 |
| 2002/0116507 | A1* | 8/2002 | Manjure et al. | 709/229 |
| 2006/0259584 | A1 | 11/2006 | Watson et al. | |
| 2009/0313506 | A1* | 12/2009 | Elizarov et al. | 714/37 |

\* cited by examiner

*Primary Examiner* — Michael Nghiem
*Assistant Examiner* — Alexander Satanovsky
(74) *Attorney, Agent, or Firm* — Lowe Graham Jones PLLC (57) ABSTRACT

Testing systems and methods are operable to perform diagnostic testing of a remote electronic device under test (DUT). An exemplary embodiment establishes a communication link between a diagnostic test device and the electronic DUT, receives a plurality of diagnostic commands from the electronic DUT, each of the plurality of diagnostic commands defined by at least one device diagnostic instruction (DDI) and a corresponding DDI description; generates a diagnostics script based upon selection of at least one of the diagnostic commands, wherein the generated diagnostics script includes at least one return device diagnostic instruction (RDDI) corresponding to the selected at least one diagnostic command; and transmits the at least one RDDI from the diagnostic test device to the DUT.

20 Claims, 4 Drawing Sheets

SYSTEMS AND METHODS FOR REMOTE ELECTRONICS DEVICE TESTING

BACKGROUND

Remote electronic devices may be relatively sophisticated, performing a variety of services and functions. For example, a set top box (STB) is a media device that receives programming content from a head end system operated by a program provider. The STB provides selected programming to a media presentation device, such as a television, based upon commands from a viewer. Accordingly, the STB must be operable to receive one or more programming content streams having hundreds of different channels of available programming, operable to access a selected program on a particular program channel from one or more received programming content streams, operable to construct the selected program into an audio and video stream that is supplied to the television. Most STBs are also operable to record programs in a digital video recorder or another recording medium attached to the STB. Further, most STBs are operable to be controlled by a remote unit that transmits wireless signals to the STB.

STBs typically receive one or more program content streams via a satellite signal distribution system or a cable distribution system. In such systems, the STB is further operable to perform two-way communications with the head end system that provides the program content streams to the STB. Thus, the STB may be configured to receive diagnostic test instructions and/or repair instructions, and then return diagnostic test results. The test device may be located at the head end facility and communicate with the STB over the cable connection. Or, a backchannel connection, an Internet Protocol (IP) connection, or other suitable two-way connection, may be provided that allows a satellite-based STB to communicate with the test device.

For example, a customer may have an operating problem with their STB. A technician, using the test device, may establish a communication link with the STB and remotely initiate various diagnostic tests to ascertain the nature of the problem at the STB. Further, the technician may remotely provide repair instructions (code, operating instructions, data, or the like) to the STB to repair any discovered problems at the STB. An exemplary diagnostic testing system for a remote STB is disclosed in U.S. Pat. No. 7,308,492, "Method And Apparatus For Use In Remote Diagnostics" to Konopka et al., which is incorporated herein by reference in its entirety.

However, before any remote diagnostic testing can begin, there is a presumption that the technician has precise knowledge about what electronic device is being tested. For example, the technician must know what type and/or model of STB that is being diagnosed so that appropriately formatted diagnostic instructions and/or repair instructions can be sent to the STB. Further, the test device must be configured to receive returned test result information from the STB.

When the technician is performing remote diagnostics on a relatively few number of different types of electronic devices, the task of keeping track of precisely which type of remote electronic type is under test is manageable. For example, a database correlating identifiers, such as a customer name, an address or an account number, may be used to precisely identify the electronic device under test (DUT).

However, with the profusion of different technologies, expanding customer bases, different vendors, various software releases, and/or different device models, the task of determining precisely which type of electronic device is under test becomes exceedingly difficult. If the electronic DUT is not precisely identified, then any diagnostic instructions communicated from the test device will not be properly processed by the electronic DUT. Further, return information from the electronic DUT to the test device may not be properly interpreted or decoded.

To further complicate matters, electronic devices are becoming increasingly more complex. One skilled in the art could envision a multi-function home electronics device that performs, for example, the functions of receiving media content from a media content provider (much like a conventional STB), controlling home security functions provided by a security company (much like a home alarm system), and controlling home appliances (much like an air conditioning and/or heating appliances thermostat). Here, it may be desirable to provide limited remote diagnostic and control access to the different involved parties. For example, the technician for the media service provider should be able to perform diagnostics and/or repairs to the media function of the home electronics device, but not have access to the home security functions or appliance control functions of the home electronics device.

Accordingly, there is a need in the arts to circumvent the difficult task of precisely identifying remotely located electronic devices that are under test, and/or to provide limited remote diagnostic and/or repair access to specific functions of the electronics device.

SUMMARY

Systems and methods of performing diagnostic testing of a remote electronic device under test (DUT) are disclosed. An exemplary embodiment establishes a communication link between a diagnostic test device and the electronic DUT, receives a plurality of diagnostic commands from the electronic DUT, each of the plurality of diagnostic commands defined by at least one device diagnostic instruction (DDI) and a corresponding DDI description; generates a diagnostics script based upon selection of at least one of the diagnostic commands, wherein the generated diagnostics script includes at least one return device diagnostic instruction (RDDI) corresponding to the selected at least one diagnostic command; and transmits the at least one RDDI from the diagnostic test device to the DUT Another exemplary embodiment establishes a communication link between a diagnostic test device and the electronic DUT; communicates a plurality of diagnostic commands from the electronic DUT to the diagnostic test device, each of the plurality of diagnostic commands defined by at least one device diagnostic instruction (DDI) and a corresponding DDI description; and receives at least one RDDI based upon selection of at least one of the diagnostic commands, wherein the at least one RDDI corresponds to the selected at least one of the diagnostic commands.

BRIEF DESCRIPTION OF THE DRAWINGS

Preferred and alternative embodiments are described in detail below with reference to the following drawings.

DETAILED DESCRIPTION

Figure 1:
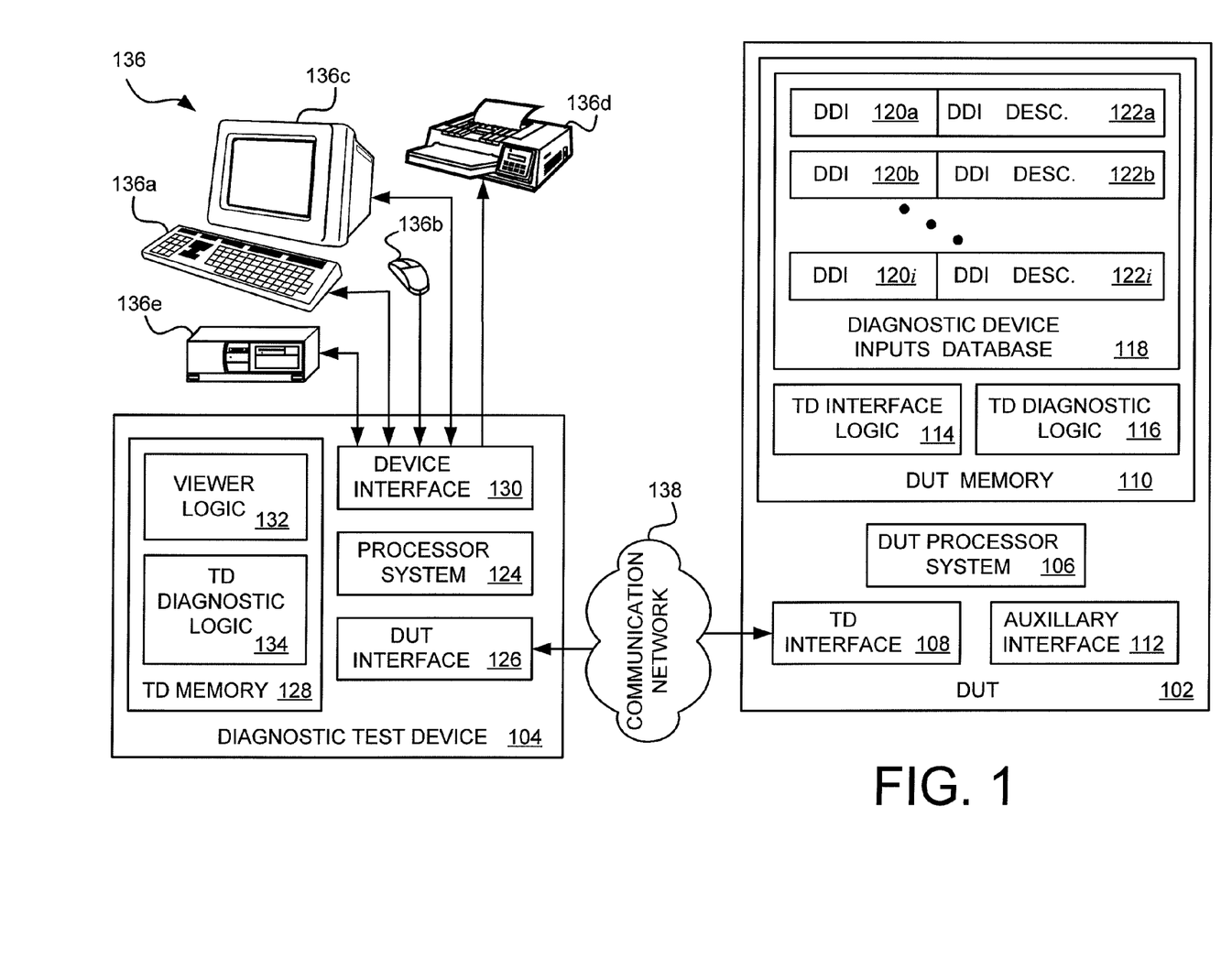
FIG. 1 is a block diagram of an embodiment of the remote diagnostic system.

FIG. 1 is a block diagram of an embodiment of the remote diagnostic system 100. In an exemplary embodiment, the remote diagnostic system 100 provides remote testing of a remote electronic device under test (DUT) 102 from a diagnostic test device 104. In the various embodiments, the electronic DUT 102 is operable to transmit diagnostic testing capabilities to the diagnostic test device 104 in the form of diagnostic commands. The diagnostic commands may be standardized. The diagnostic test device 104, based upon input from a technician, generates a diagnostics script that includes one or more response device diagnostic instructions (RDDIs). The RDDIs are returned from the diagnostic test device 104 to the electronic DUT 102. The electronic DUT 102 then performs an operation in accordance with the received RDDIs (diagnostic test instructions, debug, and/or repair instructions).

One or more diagnostic commands are provided by the DUT 102 to the diagnostic test device 104 in a standardized format. A diagnostic command includes a DDI and a corresponding DDI description. The DDI description is a textual description of the diagnostic operation that the DUT 102 will perform in response to receiving the diagnostics script that includes the corresponding DDI. In some instances, the diagnostic command will include information indicating the nature of a diagnostic response that will be communicated back to the diagnostic test device 104 once the DDI is performed by the electronic DUT 102.

For example, a simple diagnostic test performed by the electronic DUT 102 may be to "turn off" and then "turn on." The diagnostics script is generated having a first RDDI to "turn off" (a description of the diagnostic action that will be performed). The first RDDI will be communicated from the electronic DUT 102 to the diagnostic test device 104. That RDDI will, if returned by the diagnostic test device 104 to the electronic DUT 102, cause the electronic DUT 102 to turn off.

In some situations, the diagnostic command will indicate that one or more diagnostic results will be returned to the diagnostic test device 104 in response to performing a specific DDI. For example, the diagnostic command will indicate that the electronic DUT 102 will return a first response to the diagnostic test device 104 to indicate successful performance of the DDI (for example, but not limited to, a "1" or a text string such as "successful" will be returned to indicate that the electronic DUT 102 successfully turned off), and that a second indicia will be returned from the electronic DUT 102 to the diagnostic test device 104 to indicate unsuccessful performance of the DDI (for example, but not limited to, a "0" or a text string such as "unsuccessful" will be returned to indicate that the electronic DUT 102 did not successfully turn off).

A second RDDI will be included in the diagnostics script to "turn on" (a description of the diagnostic action that will be performed) the electronic DUT 102. The second RDDI is communicated from the electronic DUT 102 to the diagnostic test device 104 that the second RDDI will, if returned by the diagnostic test device 104 to the electronic DUT 102, cause the electronic DUT 102 to turn on. In some situations, the second diagnostic command will indicate that the electronic DUT 102 will return a response to indicate successful performance and/or unsuccessful performance of the DDI.

In the above simplified example, any number of different types of electronic DUTs 102 may be configured to transmit these two diagnostic commands to the diagnostic test device 104. However, the implementation of these two diagnostic commands may be quite different between one type of electronic DUT 102 and another type of electronic DUT 102. That is, the DDIs to "turn off" and to "turn on" for different electronic DUTs 102 may be quite different. Here, differences between types of electronic DUTs 102 to the diagnostic test device 104 is transparent. That is, the diagnostic test device 104 does not need any a priori knowledge about the electronic DUT 102. The diagnostic test device 104 may transmit RDDIs that will turn off and turn on any type of electronic DUT 102 that has announced the two exemplary diagnostic commands. The diagnostics scripts with specified RDDIs are generated by the diagnostic test device 104 such that the RDDIs are then returned to the corresponding electronic DUT 102.

The diagnostics script may include information that control release of RDDIs to the DUT 102. For example, the diagnostics script may control the timing of the release of the RDDIs to the DUT 102. In the above example wherein the diagnostic test device 104 transmits RDDIs to turn off, and then turn on, the DUT 104, there may be a time delay of a few seconds specified in the diagnostic test device 104 such that the "turn on" RDDI is sent to the DUT 104 a few seconds after the "turn off" RDDI is sent to the DUT 104. Or, the diagnostics script may include some type of logic that sends a RDDI to the DUT 104 based on the response returned by the DUT 104 to a previously transmitted RDDI.

In practice, any particular electronic DUT 102 may announce to a diagnostic test device 104 any number of diagnostic commands that it will accept from the diagnostic test device 104. Thus, once a communication link has been established between the diagnostic test device 104 and the electronic DUT 102, the electronic DUT 102 may announce to the diagnostic test device 104 a set of diagnostic commands that the electronic DUT 102 will respond to if a particular DDI is returned to it from the diagnostic test device 104.

An exemplary electronic DUT 102 comprises a DUT processor system 106, a test device (TD) interface 108, a DUT memory 110, and an optional auxiliary interface 112. Portions of the DUT memory 110 store TD interface logic 114, diagnostic logic 116, and a diagnostics device input database 118.

The diagnostics device input database 118 includes a plurality of diagnostics device inputs (DDIs) 120a-120i and corresponding DDI descriptions (DDI Desc.) 122a-122i. The DDIs 120a-120i include device specific commands that the electronic DUT 102 will respond to. The DDI descriptions 122a-122i include information pertaining to its corresponding DDI, such as information describing the function of that corresponding DDI command and/or information indicating a related response of the electronic DUT 102 once the DDI is performed by the electronic DUT 102.

The diagnostic logic 116 is configured to respond to the DDIs. For example, a DDI may define a diagnostic command to test or diagnose a particular function or feature of the DUT 102. However, the test or diagnosis process itself may be relatively complex. For example, a series of a plurality of operations may be performed by the DUT 102 to conduct a test or diagnostic associated with a single DDI. Accordingly, the operations to perform that particular test or diagnostic function reside in the TD diagnostic logic 116.

For example, if the DDI 120a is configured to cause the electronic DUT 102 to turn off, then the DDI 120a comprises a device specific standardized command that causes the electronic DUT 102 to perform that designated function ("turn off"). If the DUT 102 receives the RDDI from the diagnostic test device 104 (based upon a generated diagnostics script), then the series of operations that cause the DUT 102 to turn off is retrieved from the TD diagnostic logic 116 and is executed.

Descriptions describing the nature of a DDI are associated with each DDI. For example, the corresponding DDI description 122a for the DDI 120a (to "turn off" the DUT 102) is a description that indicates that the electronic DUT 102 will turn itself off when the DDI 120a is returned to the electronic DUT 102. The DDI description 122a may optionally indicate responses that will be returned to the diagnostic test device 104. For example, the electronic DUT 102 may successfully or unsuccessfully be turned off in response to receiving the DDI 120a. Thus, an exemplary DDI description 122a may include three data fields: "Turn Off", "1"=successful operation, "0"=unsuccessful operation. As another exemplary description, an exemplary DDI description 122a may include three data fields: "Turn Off", "successful"=successful operation, "unsuccessful"=unsuccessful operation.

As another example, if the DDI 120b is configured to cause the electronic DUT 102 to turn on, then the DDI 120b is a device specific standardized command to perform that designated function ("turn on"). The DDI description 122b would indicate that the DDI 120b causes the electronic DUT 102 to turn itself on. The DDI description 122b could also optionally indicate responses to indicate if the electronic DUT 102 is successfully or unsuccessfully turned on. Thus, an exemplary DDI description 122b may include three data fields: "Turn On", "1"=successful operation, "0"=unsuccessful operation). As another exemplary description, an exemplary DDI description 122b may include three data fields: "Turn On", "successful"=successful operation, "unsuccessful"=unsuccessful operation The optional auxiliary interface 112 communicatively couples another electronic device to the electronic DUT 102. The electronic DUT 102 then control the other electronic device, receive information from the other electronic device, and/or provide information to the other electronic device. Accordingly, DDIs may be configured to control and/or perform diagnostics on the other electronic device, or perform diagnostics regarding the interaction between the electronic DUT 102 and the other electronic device.

It is appreciated that the electronic DUT 102 is any type of electronic-based device that performs one or more designated functions relating to the intended purpose of the electronic DUT 102. Thus, the electronic DUT 102 embodiment includes other components and or systems not discussed herein. Embodiments of the remote diagnostic system 100 may be implemented in any suitable electronics device that may need testing and/or fixing based upon one or more diagnostic instructions received from the diagnostic test device 104.

An exemplary diagnostic test device 104 comprises a test device (TD) processor system 124, a DUT interface 126, a TD memory 128, and one or more device interfaces 130. Portions of the TD memory 128 store viewer logic 132 and TD diagnostic logic 134.

The TD diagnostics logic 134 receives and/or stores the diagnostic commands (including the DDI descriptions and associated DDIs) for access by the viewer logic 132. Thus, an interactive diagnostics session over a period of time can be conducted by the technician operating the diagnostic test device 104. Further, during intermediate periods where the technician is not actively performing diagnostics on a particular DUT 102, the technician can access and perform diagnostics on other remote DUTs 102.

A plurality of input/output (I/O) devices 136 are communicatively coupled to the one or more device interfaces 130. Examples of the I/O device 136 include, but are not limited to, a keyboard 136a, a mouse interface device 136b, a display 136c, a printer 136d, and a memory unit 136e.

A technician performing a diagnostic test or repair of the remote electronic DUT 102 may provide instructions via the keyboard 136a, and/or operate an interactive graphical user interface (GUI) displayed on the display 136c using the mouse interface device 136b. The diagnostic test device 104, and/or the technician, may print various diagnostic related reports on the printer 136d and/or store various diagnostic related information into the memory unit 136e. In some embodiments, one or more of the I/O devices 136 are integrated components of the diagnostic test device 104. For example, the memory unit 136e may reside in the diagnostic test device 104, or may be included as part of the TD memory 128.

The TD interface 108 in the electronic DUT 102 and the DUT interface 126 in the diagnostic test device 104 are interfaces configured to establish a communication link between the electronic DUT 102 and the diagnostic test device 104, via a communication network 138. Once the communication link is established between the electronic DUT 102 and the diagnostic test device 104, DDIs and DDI descriptions may be announced by the electronic DUT 102 to the diagnostic test device 104, DDI instructions may be sent to the electronic DUT 102 from the diagnostic test device 104, and/or information indicating a related response may be sent from the electronic DUT 102 to the diagnostic test device 104.

The communication network 138 is illustrated as a generic two-way communication system. In one embodiment, the communication network 138 comprises the Internet. Accordingly, the DUT interface 126 and/or the TD interface 108 is a suitable modem or Internet connection device. Alternatively, the communication network 138 may be a telephony system, a radio frequency (RF) wireless system, a microwave communication system, a fiber optics system, an intranet system, a local access network (LAN) system, an Ethernet system, a cable system, a radio frequency system, a cellular system, an infrared system, a satellite system, or a hybrid system comprised of multiple types of communication media. Additionally, embodiments of the remote diagnostic system 100 may be implemented on other types of communication technologies, such as but not limited to, digital subscriber loop (DSL), X.25, Internet Protocol (IP), Ethernet, Integrated Services Digital Network (ISDN) and asynchronous transfer mode (ATM). Also, embodiments of the remote diagnostic system 100 may be employed on combination systems having a plurality of segments which employ different formats for each segment employing different technologies on each segment.

Figure 2:
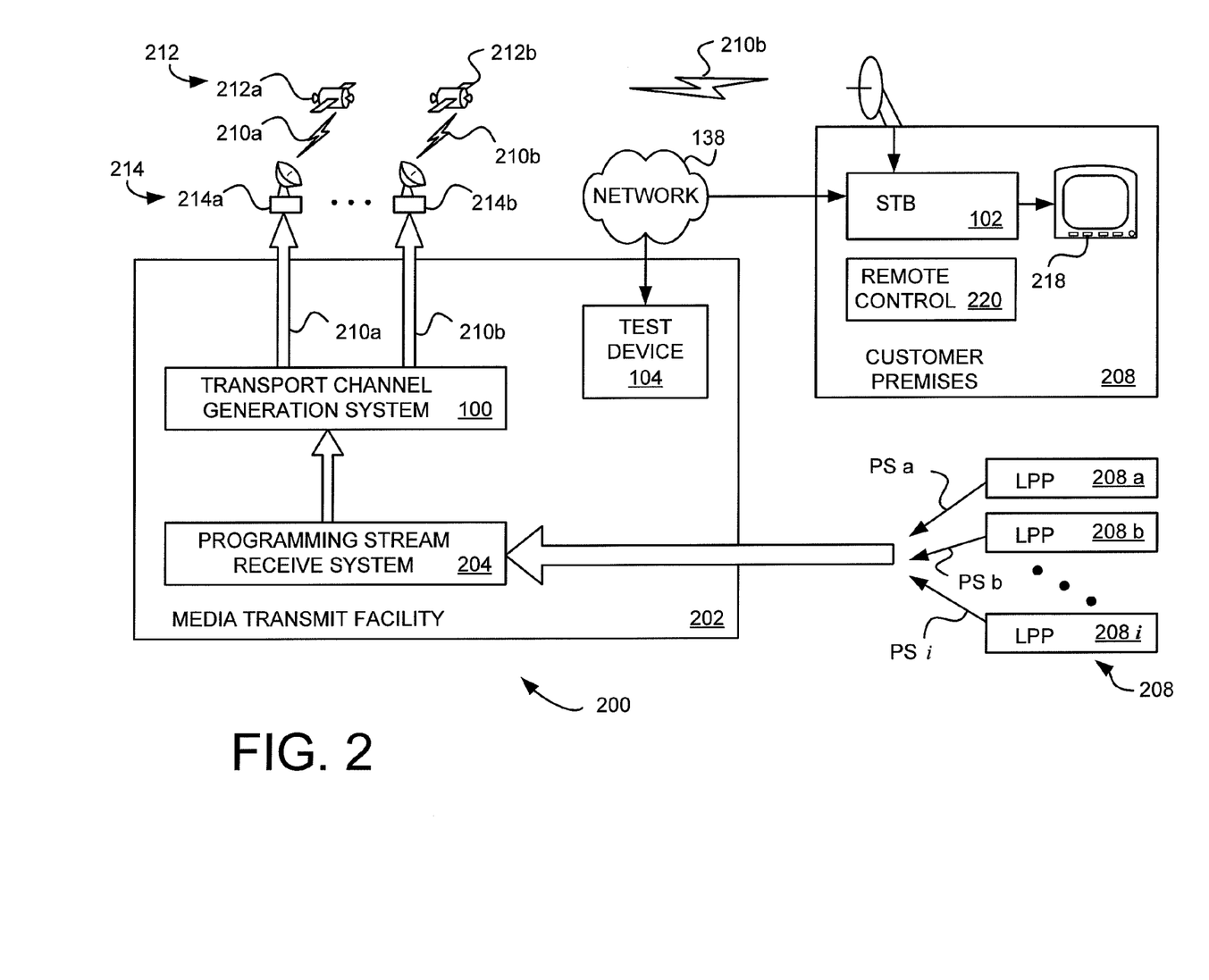
FIG. 2 is a block diagram of an exemplary embodiment of the remote diagnostic system implemented in a media provider's communication system.

FIG. 2 is a block diagram of an exemplary embodiment of the remote diagnostic system 100 implemented in a media provider's communication system 200. A media transmit facility 202 provides programming to the DUT 102, denoted as a "set top box" (STB) 102, in this exemplary implementation of the remote diagnostic system 100.

In this simplified example, a programming stream receive system 204 and a transport channel generation system 206 reside at the media transmit facility 202. In overview, a plurality of programs Pa-Pz are provided by a plurality of local programming providers 208 (LPPs 208a-208z), typically in a streaming fashion, to the programming stream receive system 204. The programming stream receive system 204 prepares the received plurality of programs Pa-Pz in a format that is suitable for communication to the transport channel generation system 206. The transport channel generation system 206 bundles the received programs Pa-Pz on a selective basis and generates one or more transport channels 210.

Here, the exemplary media provider provides programming to its customers via a plurality of satellites 212. The transport channel 210 is uplinked to each satellite 212 through a corresponding transmit antenna 214. The respective transport channel 210 is then communicated from the satellite 212 down to a receiver antenna 216 at the customer premises 208. For example, selected ones of the programs Pa-Pz that are bundled into the transport channel 210b are uplinked from the transmit antenna 214b to the satellite 212b, and then communicated from the satellite 212b to the receiver antenna 216. The receiver antenna 216 may be configured to receive multiple transport channels 210.

The transport channel 210b is then received by the STB 102. The STB 102 is illustrated as coupled to a media presentation device, here a television 218. Optionally, a remote control 220 may be configured to control the STB 102 and/or the television 218. Thus, a viewer may select one of the programs Pa-Pz for viewing and/or recording.

Other media providers may provide programming to their customers via other types of communication systems. For example, some media providers may use a cable network or the Internet to provide programming to their customers. Embodiments of the remote diagnostic system 100 may be configured to operate over any suitable type of media provider communication system 200.

In the illustrative example of FIG. 2, an embodiment of the remote diagnostic system 100 is described in the context of a satellite-based media system that provides programming content to a media device, such as a STB 102. Accordingly, the illustrated STB 102 is the electronic DUT 102. Embodiments of the remote diagnostic system 100 may be implemented in a cable-based media system.

Further, embodiments of the remote diagnostic system 100 may be implemented in any type of system wherein a remote electronic device under test is operable to transmit test capabilities to the diagnostic test device 104, and then receive diagnostic test instructions and/or repair instructions from the diagnostic test device 104. The electronic DUT 102 may be a relatively simple device with one function or a limited set of functions. Other electronic DUTs 102 may be a very complex system with many functions controlled by one or more processing systems.

Figure 3:
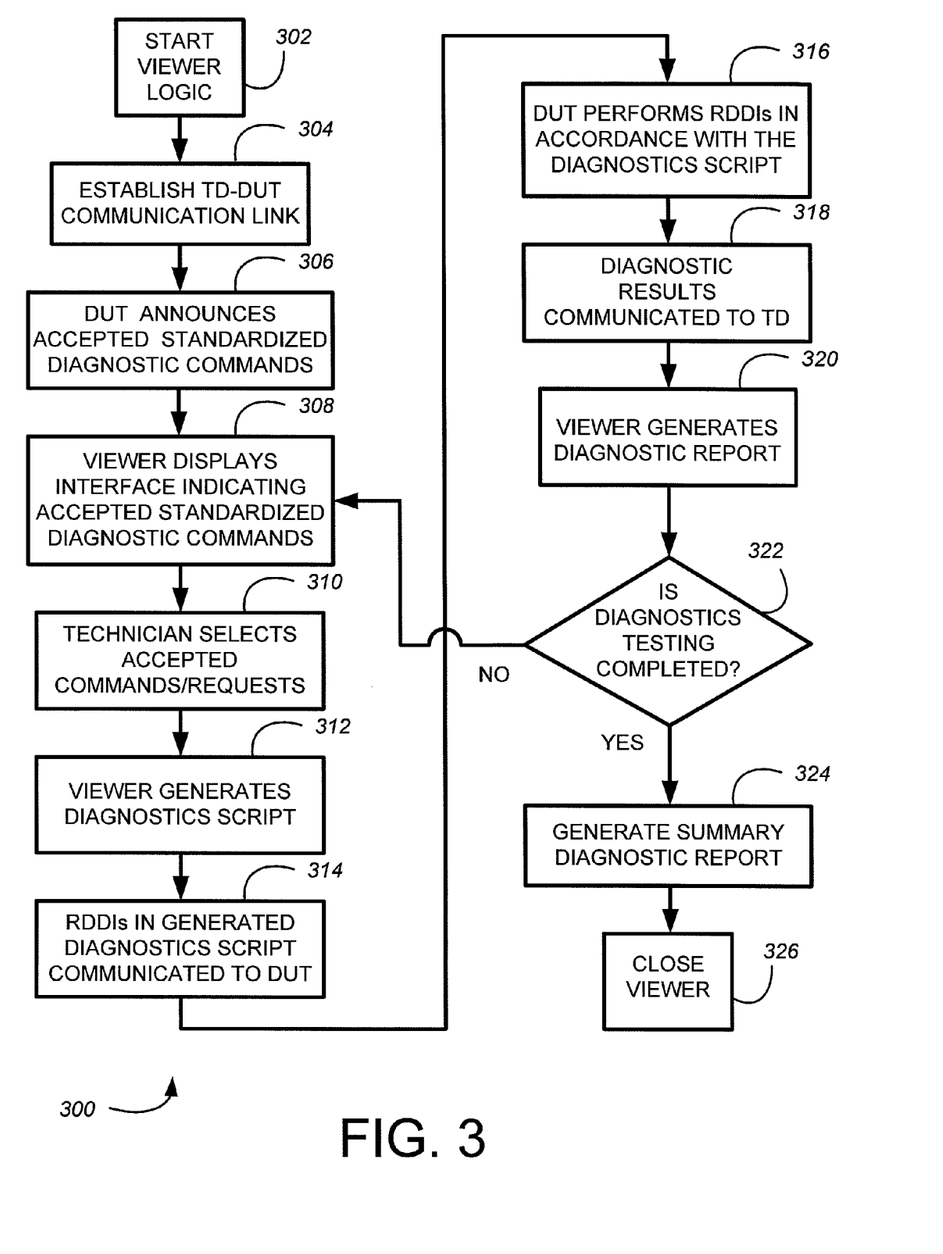
FIG. 3 is a flow chart illustrating an exemplary process of performing diagnostics on a remote electronic device under test from a test device.

FIG. 3 is a flow chart illustrating an exemplary process 300 of performing diagnostics on the remote electronic DUT 102 from the diagnostic test device 104. With respect to FIG. 3, the process 300 starts at block 302, for example, in response to the starting of the viewer logic 132 (FIG. 1), generally referred to hereinafter as the "viewer." At block 304, a communication link is established between the diagnostic test device 104 and a selected electronic DUT 102. The communication link is established over the communication network 138.

At block 306, the electronic DUT 102 announces at least one accepted diagnostic command, which includes the related DDI and DDI descriptions describing the diagnostic testing capabilities of the electronic DUT 102.

At block 308, the viewer 132 processes the received diagnostic commands and generates an interface that is displayed on the display 136c. The interface is viewed by the technician performing the diagnostics on the electronic DUT 102. Here, the viewer 132 uses the DDI description to display text or other indicia so that the technician appreciates what a particular diagnostic test that the electronic DUT 102 will do if the DDI is returned (as a RDDI) to the electronic DUT 102. That is, the interface indicates what device specific commands can be selected by the technician. Preferably, the interface displayed on the display 136c will include a diagnostic command selection means, such as a selector, button, tab or the like for the technician that is selectable using the mouse 136b or other suitable selection device.

At block 310, the technician selects one or more of the accepted diagnostic commands. In response to the selection of one or more diagnostic commands by the technician, the viewer 132 generates the diagnostics script at block 312. The diagnostics script includes, in part, a listing of one or more device specific RDDIs. At block 314, the RDDIs are communicated from the diagnostic test device 104 to the electronic DUT 102 in accordance with the generated diagnostics script.

At block 316, the electronic DUT 102 performs the operations corresponding to the RDDIs specified in the diagnostics script. At block 318, diagnostic results are communicated from the electronic DUT 102 to the diagnostic test device 104. Diagnostic results indicate whether the electronic DUT 102 successfully performed, or unsuccessfully performed, the specified RDDI. In some instances, a device specific command will instruct the electronic DUT 102 to collect data or information. The data or information may be collected over some current operating period, or may be data or information retrieved from a database (not shown) in the electronic DUT 102. For example, a variable value of sensed parameter, such as a voltage level, may be a returned response. As another non-limiting example, a number of operations performed, such as a number of device re-boots, may be a returned response. Any suitable type of information may be included in a returned response.

It is appreciated that the information in a DDI and a corresponding RDDI are identical. That is, the DDI and the corresponding RDDI are the same device specific command that is accepted by the DUT 102.

At block 320, the viewer 132 processes the returned diagnostic results received from the electronic DUT 102 to generate a diagnostics report. The diagnostics report provides information describing the response of the electronic DUT 102 to received device specific commands (DDIs) that is understandable by the technician. The diagnostics report may be presented on the display 136c, printed by the printer 136d, or stored in the memory unit 136e. Alternatively, or additionally, the returned diagnostic results may be stored in the memory unit 136e for later processing.

At block 322, a determination is made whether the diagnostics process has been completed. If the diagnostics process has not yet been completed (the "NO" condition), the process returns to block 308 where the viewer 132 displays the same interface, or an updated interface, that indicates what additional device specific commands can be selected by the technician.

If the diagnostics process has been completed (the "YES" condition), then at the optional block 324 a summary diagnostic report may be generated. The summary diagnostic report may be displayed, printed or stored to document the overall diagnostics preformed on and responses of the electronic DUT 102. At block 326 the viewer 132 is closed. Alternatively, the viewer 132 may remain open so that testing on a different electronic DUT 102 may be performed (in which case, the process returns to block 304).

Figure 4:
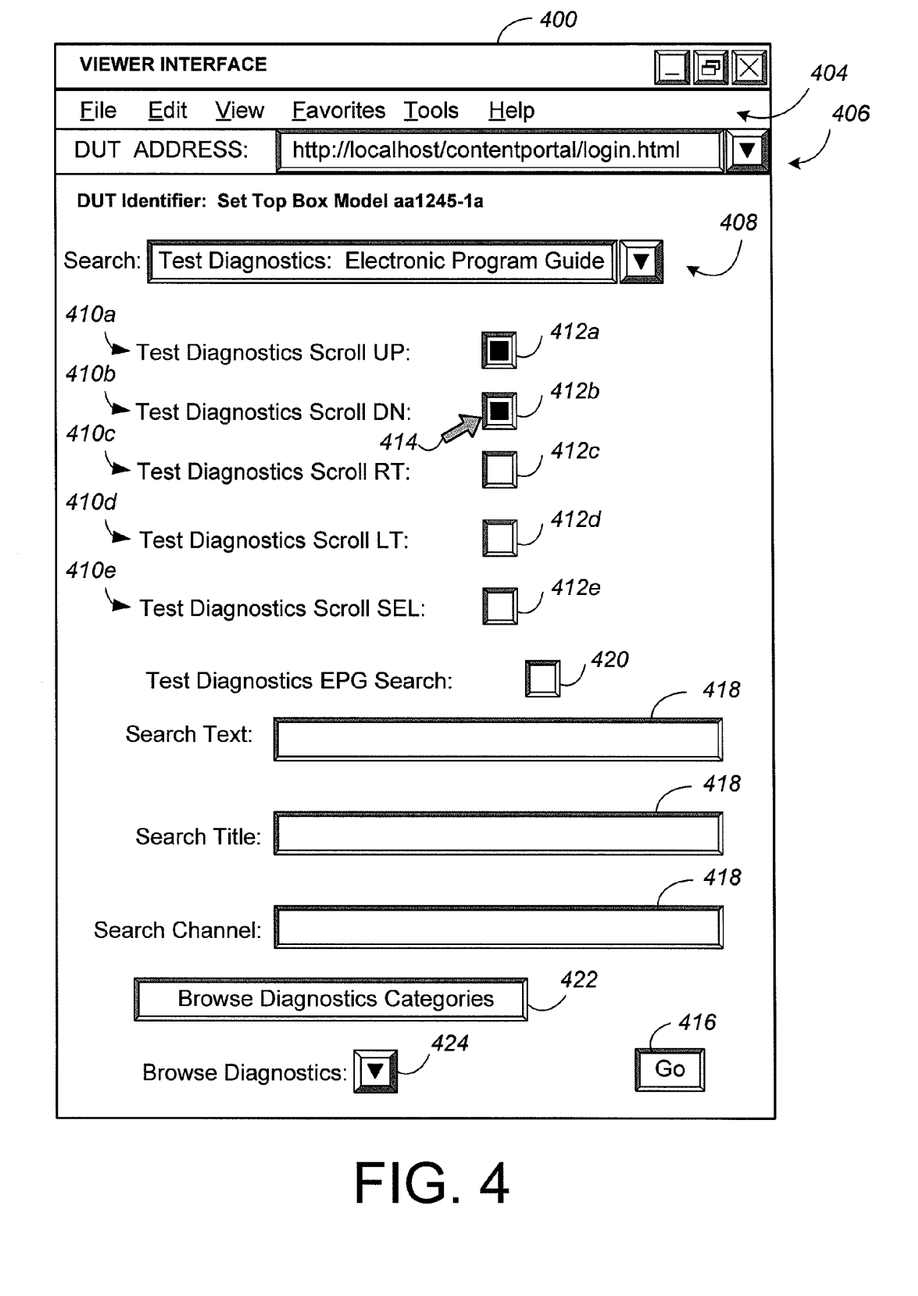
FIG. 4 illustrates an exemplary interface generated by the viewer.

FIG. 4 illustrates an exemplary graphical user interface (GUI) 402 generated by the viewer 132. The GUI 402 is presented on the display 136c (FIG. 1) and is viewable by the technician performing diagnostics on the remote electronic DUT 102. The exemplary GUI 402 indicates selectable device specific commands to the technician.

The GUI 402 is shown as a window type formatted graphical user interface. In other embodiments, different formats for the GUI 402 may be used to indicate selectable device specific commands to the technician.

The GUI 402 includes a description of the device specific commands accepted by the electronic DUT 102. The GUI 402 further displays one or more selection means, referred to herein as a selector, that the technician uses to select device specific commands accepted by the DUT 102.

The exemplary GUI 402 relates to the STB 102 of FIG. 2. Here, it is assumed that the technician is performing diagnostics on an electronic program guide (EPG) feature. EPGs are presented on the television 218 and displays to a viewer current and scheduled programming that is available on the STB 102. The viewer is able to navigate about the displayable EPG and select programs of interest for viewing and/or recording. However, it may be appropriate to perform remote diagnostics on the EPG feature or functions. Thus, the technician has operated the diagnostic test device 104 to establish a communion link to the STB 102. The STB 102, at this point, has already announced the selectable device specific commands to the diagnostic test device 104. The viewer 132 has generated the GUI 402 which shows selectable device specific commands to the technician.

The exemplary GUI 402 indicates a plurality of selectable tools on a toolbar 404. An optional portion 406 of the GUI 402 indicates the address of the electronic DUT 102 that the diagnostic test device 104 is currently linked to. A pull down or drop down feature may be available to list electronic DUTs 102 that the diagnostic test device 104 was previously linked to. The portion 406 may also indicate a name, model number, and/or other identifier associated with the current electronic DUT 102. This information identifies the electronic DUT 102 that the diagnostic test device 104 is currently linked to so that the technician can direct diagnostics performed by the electronic DUT 102.

The exemplary GUI 402 includes a diagnostic category portion 408 that identifies diagnostic categories for which the displayed device specific commands to the technician. A diagnostic category identifies related device specific commands that can be used to diagnose a particular component, feature and/or function of interest of the electronic DUT 102. In this simplified example of the GUI 402, the identified diagnostic category relates to the EPG function of the STB 102.

The diagnostic category portion 408 may be searchable. For example, a pull down tab or the like may be used to generate a listing of available diagnostic categories. For example, if diagnostics are being performed on the STB 102, non-limiting examples of diagnostic categories may include the EPG function, the digital video recorder, antenna reception, tuner operation, channel availability, or signal output to the television 218. Here, actuation of the pull down tab results in the display of available diagnostic categories for that particular electronic DUT 102.

A listing of available diagnostic categories may be provided by the electronic DUT 102. The listing may be provided after the diagnostic test device 104 has established the communication link to the electronic DUT 102. Or, the list may be provided by the electronic DUT 102 in response to a request made by the viewer 132. Alternatively, or additionally, the list of available diagnostic categories may be stored in the TD memory 128.

Further, the types of available diagnostic categories may change depending upon the particular electronic DUT 102 that is currently linked to the diagnostic test device 104. Thus, if the electronic DUT 102 is a home security electronic device, the available diagnostic categories may relate to components, features, and/or functions of the home security device itself, and/or may relate to the security sensors that provide inputs to the home security device. In some embodiments, a query-response system is implemented in an embodiment whereby the technician operating the diagnostic test device 104 requests authorization to perform diagnostics on the DUT 102. An authorized individual at the DUT 102, or from another device, provides the authorization to the technician to perform the diagnostics on the DUT 102.

In some instances, the electronic DUT 102 may be a very complex, multi-function device. For example, the electronic DUT 102 may be a multi-function home electronics device that performs, for example, the functions of receiving media content from a media content provider (similar to a conventional STB), controlling home security functions provided by a security company (similar to a home alarm system), and controlling home appliances (similar to an air conditioning and/or heating appliances thermostat). Here, an embodiment of the remote diagnostic system 100 provides limited remote diagnostic and control access to the different involved parties that are accessing the electronic DUT 102 via their respective test devices 104 by controlling which diagnostic categories are available to a particular diagnostic test device 104.

In this embodiment, the diagnostic test device 104 provides an identifier to the electronic DUT 102 when it established its communication link to the electronic DUT 102. For example, the home security provider's diagnostic test device 104 would indicate to the electronic DUT 102 that the home security components, features, and/or functions of the electronic DUT 102 will be diagnosed by a technician working for the home security provider. Thus, access to other components, features, and/or functions of the electronic DUT 102 are not accessible. In an exemplary embodiment, the electronic DUT 102 provides the security company's diagnostic test device 104 a list of available diagnostic categories and/or diagnostic commands which pertain only to the security-related components, features, and/or functions of the electronic DUT 102. Available diagnostic categories and/or diagnostic commands that are not related to the security of the DUT 102 are not communicated to the diagnostic test device 104.

In some embodiments, upon initialization of the communication link between the electronic DUT 102 and the diagnostic test device 104, an identifier, such as a special authorization code, a security code, or access code, is required from the diagnostic test device 104 before the electronic DUT 102 announces its available diagnostic categories and/or diagnostic commands. Thus, the received plurality of diagnostic commands from the DUT 102 correspond to diagnostics that the diagnostic test device 104 is authorized to perform.

Alternatively, or additionally, the authorization, security, or access code is required before the electronic DUT 102 accepts the RDDIs (in accordance with the generated diagnostics script) from the diagnostic test device 104, and/or performs the diagnostic operations in accordance with the received RDDIs. Thus, the identifier is associated with diagnostic operations that the test device 104 is authorized to perform.

In the exemplary GUI 402 of FIG. 4, five DDI descriptions 410a-410e are listed on the GUI 402. These exemplary DDI descriptions include: a DDI description 410a that indicates that a corresponding diagnostic command will cause the active pane of the EPG to scroll upward ("scroll UP"), a DDI description 410b that indicates that a corresponding diagnostic command will cause the active pane of the EPG to scroll downward ("scroll DN"), a DDI description 410c that indicates that a corresponding diagnostic command will cause the active pane of the EPG to scroll left ("scroll LT"), a DDI description 410d that indicates that a corresponding diagnostic command will cause the active pane of the EPG to scroll right ("scroll RT"), and a DDI description 410e that indicates that a corresponding diagnostic command will cause the active pane of the EPG to be selected ("scroll SEL").

Associated with each of the five DDI descriptions 410a-410e is a selector, here illustrated as a selectable button 412a-412e. Thus, the "Scroll UP" and "Scroll DN" diagnostic commands have been selected by the technician. Here, selection is effected by moving a cursor 414 or the like to a position over or in proximity to one of the selectable buttons 412a-412e. Actuation of the mouse 136b (such as by "right clicking" or the like) causes selection of the diagnostic command associated with the selected button 412a-412e.

In the various embodiments, each of the plurality of DDI descriptions is associated with a corresponding selector. Also, each of the plurality of DDI descriptions is associated with one of a plurality of DDIs. Thus, each selector is operable to select the DDI that corresponds to the DDI description.

If the technician, in this simplified example, chooses to send the two selected diagnostic commands to the STB 102, then the technician selects the "Go" button 416 (illustrated at the bottom right corner of the GUI 402). In response to the selection of the "Go" button 416, the viewer 132 generates the diagnostics script having the commands necessary (the RDDIs) to cause the STB 102 to scroll a highlighted program up, and then down. The diagnostics script generated by the viewer 132 is based on the specific DDIs previously announced by the STB 102 for those two particular diagnostic commands.

However, the technician may wish to perform a more complex diagnostic process on the exemplary simplified EGP function of the STB 102. Accordingly, the technician may select other diagnostic commands to construct a series of diagnostic commands, via the GUI 402.

When the DUT 102 is a relatively complex electronics device, and thus has a relatively large number of announced diagnostic commands, the number of diagnostic commands that may be presented on a single view of the GUI 402 may be limited by the viewable area of the GUI 402. That is, not all selectable device specific commands can be presented to the technician on a single view of the GUI 402. Further, in the simplified example illustrated by FIG. 4, the technician may wish to test integration of the EPG with other functions and/or features of the STB 102, and/or separately test other functions and/or features of the STB 102. Thus, the GUI 402 provides various means for the technician to access other diagnostic commands that are not presented on the current view of the GUI 402.

For example, the technician may wish to search for available diagnostic commands. In some embodiments, one or more text boxes 418, which may be related by topic or subject, may be filled out by the technician to effect a search for diagnostic commands of interest. After filling out one or more of the text boxes 418, selection of the search button 420 initiates the text-based search for the diagnostic commands of interest.

Alternatively, or additionally, a listing of available diagnostic categories may be presented on a pull down page, or even a new page, upon selection of the "Browse Diagnostics Categories" button 422. The list of available diagnostic categories may be presented as a listing of all of, or selected ones of, the announced available diagnostic categories provided by the electronic DUT 102. Thus, the technician may more easily select a desired diagnostic command that is to be incorporated into the diagnostics script generated by the viewer 132

Alternatively, or additionally, a listing of diagnostic commands and/or available diagnostic categories may be presented on a pull down page, or even a new page, upon selection of the "Browse Diagnostics" button 424. Upon selection of the "Browse Diagnostics" button 424, a selectable pull down menu of available diagnostic commands are displayed to the technician. Another embodiment may present a new page that lists the available diagnostic commands. The list of available diagnostic commands may be presented as a listing of all of, or selected ones of, the announced diagnostic commands provided by the electronic DUT 102. Thus, the technician may more easily select a desired diagnostic command that is to be incorporated into the diagnostics script generated by the viewer 132.

With respect to a DUT 102 that corresponds to a media device, such as a STB, various exemplary diagnosis functions can be tested. For example, the following components, features, and/or functions of a STB could include one or more of the following scenarios.

A diagnostic command may be defined to perform a signal strength test. Accordingly, an exemplary diagnostic command causes the STB to scroll through various satellites/channels and record the signal strength during a selected time period, and compares results for any low unacceptable signals that would give an idea of a bad install, bad tuner, possible bad channel from the uplink center or hardware malfunctions.

A diagnostic command may be defined to perform a video freeze or black screen test. Accordingly, an exemplary diagnostic command causes the STB to monitor video during test script, and looks for any sign where video freezes or goes black over a determined amount of time and report back details of channel, time it occurred and any logs on what occurred prior to the freeze or black screen.

A diagnostic command may be defined to test the channel up and down, and/or direct input of channels, from the main screen. Accordingly, an exemplary diagnostic command causes the STB to change channels with the up and down arrow commands, and/or causes the STB to change channels with direct entering of a particular channel number for standard definition (SD) and/or high definition (HD) channels to verify that the channel changing does not hang or lock up the STB.

A diagnostic command may be defined to monitor receiver reboots during all testing. Accordingly, an exemplary diagnostic command causes the STB to monitor the counters screen during all remote testing to compare the counts of reboots, and monitors if the counters are incremented during testing.

A diagnostic command may be defined to monitor all system counters for changes during test scenarios. Accordingly, an exemplary diagnostic command causes the STB to make note of all counter numbers before any testing has started, and then notes again after all testing is complete to compare for any increments and possible problems.

A diagnostic command may be defined for verifying digital video recorder (DVR) record and play features including various trick modes, such as pause, fast forward, fast reverse, skip back and forward, and stop. Accordingly, an exemplary diagnostic command causes the STB's DVR to record any channel, then allows for that video or any video to be played back, and then tests the DVR trick modes as described above to verify functionality and look for anomalies.

A diagnostic command may be defined to scan the EPG for any problems. Accordingly, an exemplary diagnostic command is defined such that the EPG is brought up, and then a highlighted channel is changed by using either the up or down arrow, the page up or page down button or using a direct channel entry to test accuracy, correct functionality, and verify no lockups or freezes of the EPG.

A diagnostic command may be defined to monitor DVR's for corrupted files. Accordingly, an exemplary diagnostic command causes the STB to look at the contents of all the DVR files and check for any corrupted file indicating a problem in the DVR memory.

A diagnostic command may be defined to monitor the STB system hard drive. Accordingly, an exemplary diagnostic command causes the STB to run through various trouble shooting techniques to determine if the internal hard drive is corrupted and/or can be fixed remotely, or if the system hard drive would require a replacement.

A diagnostic command may be defined to perform a hardware verification. Accordingly, an exemplary diagnostic command causes the STB to generate commands that are sent to hardware components to verify that the selected hardware is functioning within specs, monitor for any faults that can be reported, and either fixed remotely or generate alerts of a possible hardware malfunction that may require a service call.

A diagnostic command may be defined to monitor communication ports. Accordingly, an exemplary diagnostic command causes the STB to check that either the ethernet ports or phone line modem are correctly working, and to verify port speed and other communication function checks.

The above-described diagnostic commands are appreciated to be implemented by a relatively complex series of device specific operating commands. That is, a simple single device command or instruction may not be sufficient to perform a complex diagnostic test. Accordingly, the TD diagnostic logic 116 includes various predefined diagnostic tests, which may be as complex as desired, and/or which are associated with a particular DDI. Once a particular RDDI is received from the diagnostic test device 104, the corresponding diagnostic test is retrieved from the TD diagnostic logic 116 and is executed by the DUT 102.

It is appreciated that the look and feel of the GUI 402 which presents available diagnostic categories and/or selectable device specific commands to the technician may have any desired look and feel. That is, various embodiments of the viewer 132 can be configured as desired to generate any meaningful and useful graphical user interface that allows the technician to select diagnostic commands for the particular DUT 102 that the technician is diagnosing.

After the technician has selected a series of diagnostic commands, and has instructed the viewer 132 to initiate the diagnostic process, the viewer 132 constructs the diagnostics script. The diagnostics script is a command based series of RDDIs (that correspond to DDIs announced by the DUT 102) that will be accepted by the DUT 102 so as to perform the intended series of diagnostic tests of interest selected by the technician operating the GUI 402. Upon receipt of the RDDIs, the DUT 102 performs the series of diagnostic tests corresponding to the RDDIs. Results of the response of the DUT 102 to the diagnostic tests are collected. The test results are then returned to the diagnostic test device 104. The viewer 132 processes the returned test results and generates suitable reports so that the technician can understand how the DUT 102 is performing when the diagnostic tests are performed by the DUT 102.

In some embodiments, the electronic DUT 102 may announce to a diagnostic test device 104 any number of diagnostic commands that it will accept from the diagnostic test device 104 in a nested manner. For example, a particular component or function of the electronic DUT 102 may be diagnosed remotely via the diagnostic test device 104. Here, an initial set of diagnostic commands may be announced by the electronic DUT 102 which identify a plurality of different components or functions which may be tested or diagnosed by the diagnostic test device 104. Upon selection of a component or function of interest, the electronic DUT 102 may announce a second set of diagnostic commands relating to the selected component or function. Such a nested approach in providing related sets of selected diagnostic commands reduces communication bandwidth requirements, and/or reduces working memory requirements in the electronic DUT 102 and/or the diagnostic test device 104.

It should be emphasized that the above-described embodiments of the remote diagnostic system 100 are merely possible examples of implementations of the invention. Many variations and modifications may be made to the above-described embodiments. All such modifications and variations are intended to be included herein within the scope of this disclosure and protected by the following claims.

The embodiments of the invention in which an exclusive property or privilege is claimed are defined as follows:

1. A method for remote testing of an electronic device under test (DUT), the method comprising:
    establishing a communication link between a diagnostic test device and the electronic DUT;
    receiving a plurality of diagnostic commands at the diagnostic test device that are communicated from the electronic DUT, wherein each of the plurality of diagnostic commands are defined by at least one device diagnostic instruction (DDI) and a corresponding DDI description, wherein the DDI description in each of the diagnostic commands includes a textual description of a diagnostic test operation that the electronic DUT will perform in response to receiving an associated return device diagnostic instruction (RDDI), and wherein the RDDI corresponds to the device diagnostic instruction that is specific to the electronic DUT and that, when returned to and received by the electronic DUT, causes the electronic DUT to perform the diagnostic test operation described by the associated textual description of the diagnostic test operation in the DDI description;
    presenting on a display the textual description of the DDI description for each of the diagnostic commands received from the electronic DUT, wherein the presented textual description for each of the diagnostic commands are presented to a technician operating the diagnostic test device;
    receiving a selection of at least one of the diagnostic commands wherein the technician operating the diagnostic test device inputs their selection based on a selection of the associated textual description of the diagnostic test operation;
    generating a diagnostics script based upon selection of the at least one of the diagnostic commands, wherein the generated diagnostics script includes the at least one return device diagnostic instruction (RDDI) corresponding to the selected at least one diagnostic command; and
    transmitting the at least one RDDI from the diagnostic test device to the electronic DUT.

2. The method of claim 1, wherein the technician operating the diagnostic test device inputs the selection based on a selection of the associated textual description of the diagnostic test operation by the method further comprising:
    generating a graphical user interface (GUI) that is presented on the display,
    wherein the GUI presents the textual descriptions of a plurality of DDI descriptions that describe the diagnostic test operation that the electronic DUT will perform in response to receiving an associated RDDI, wherein each presented DDI description is associated with a corresponding selector, and wherein each of the plurality of DDI descriptions is associated with one of a plurality of DDIs, such that each selector is operable to select the DDI that corresponds to the DDI description.

3. The method of claim 2, further comprising:

receiving a first selection of a first selector displayed on the GUI, wherein a first DDI associated with the first selector is selected; and generating the diagnostics script, wherein the generated diagnostics script includes a first RDDI corresponding to the first selected DDI.

4. The method of claim 3, further comprising:

receiving a plurality of second selections of second selectors displayed on the GUI, wherein the plurality of second selections are selected in an order of interest; and generating the diagnostic script, wherein the generated diagnostics script includes the first RDDI followed by a plurality of second RDDIs corresponding to the selected DDIs in accordance with the order of interest.

5. The method of claim 1, further comprising:

receiving a response from the electronic DUT after the RDDI is communicated to the electronic DUT, wherein the response includes information describing the response of the electronic DUT during execution of the RDDI corresponding to the selected at least one diagnostic command.

6. The method of claim 5, wherein the selected at least one diagnostic command is a first selected at least one diagnostic command, and further comprising:

generating a second diagnostics script based upon selection of a second at least one diagnostic command, wherein the generated diagnostics script includes the RDDI corresponding to the selected second at least one diagnostic command; and communicating the RDDI in accordance with the second diagnostics script to the electronic DUT.

7. The method of claim 1, further comprising:

communicating an identifier to the electronic DUT during the establishment of the communication link between the diagnostic test device and the electronic DUT, wherein the received plurality of diagnostic commands from the electronic DUT correspond to diagnostics that the diagnostic test device is authorized to perform.

8. The method of claim 1, further comprising:

communicating an identifier to the electronic DUT with the RDDI, wherein the identifier is associated with diagnostic tests that the diagnostic test device is authorized to perform.

9. The method of claim 1, further comprising:

receiving a plurality of diagnostic categories from the electronic DUT, wherein each diagnostic category identifies related diagnostic commands that are operable to diagnose a particular component, feature or function of interest of the electronic DUT.

10. The method of claim 9, further comprising:

generating a graphical user interface (GUI) that is presented on the display, wherein the GUI includes a plurality of DDI descriptions associated with a first one of the plurality of diagnostic categories.

11. A diagnostic test device that remotely controls diagnostic tests of an electronic device under test (DUT), comprising:

a display that presents information to a technician operating the diagnostic test device;

a device interface to communicatively couple the diagnostic test device to the display;

a DUT interface to communicatively couple the diagnostic test device to the electronic DUT, wherein the DUT interface receives a plurality of diagnostic commands from the electronic DUT, each of the plurality of diagnostic commands defined by at least one device diagnostic instruction (DDI) and a corresponding DDI description, wherein the DDI description in each of the diagnostic commands includes a textual description of a diagnostic test operation that the electronic DUT will perform in response to receiving an associated return device diagnostic instruction (RDDI), and wherein the RDDI corresponds to the device diagnostic instruction that is specific to the electronic DUT and that, when returned to and received by the electronic DUT, causes the electronic DUT to perform the diagnostic test operation described by the associated textual description of the diagnostic test operation in the DDI description; and a processor system communicatively coupled to the DUT interface and the device interface, and configured to:

generate a graphical user interface (GUI) that is presented on the display, wherein the GUI includes a plurality of DDI descriptions that describe the diagnostic test operation that the electronic DUT will perform in response to receiving an associated return device diagnostic instruction (RDDI), wherein each DDI description is associated with a corresponding selector and is associated with one of a plurality of DDIs such that each selector is operable to select the DDI that corresponds to the DDI description; and generate a diagnostics script based upon selection of at least one of the diagnostic commands, wherein the generated diagnostics script includes at least one RDDI corresponding to the selected at least one diagnostic command.

12. The diagnostic test device of claim 11, further comprising:

a memory communicatively coupled to the processor system, wherein the memory stores the received plurality of diagnostic commands.

13. A method for remote testing of an electronic device under test (DUT), the method comprising:

establishing a communication link between a diagnostic test device and the electronic DUT;

communicating a plurality of diagnostic commands from the electronic DUT to the diagnostic test device, wherein each of the plurality of diagnostic commands are defined by at least one device diagnostic instruction (DDI) and a corresponding DDI description, wherein the DDI description in each of the diagnostic commands includes a textual description of a diagnostic test operation that the electronic DUT will perform in response to receiving an associated return device diagnostic instruction (RDDI), wherein the RDDI corresponds to the device diagnostic instruction that is specific to the electronic DUT and that, when returned to and received by the electronic DUT, causes the electronic DUT to perform the diagnostic test operation described by the associated textual description of the diagnostic test operation in the DDI description, and wherein the textual description is presentable on a display to a technician operating the diagnostic test device; and receiving at least one RDDI based upon selection of at least one of the diagnostic commands, wherein the at least one RDDI corresponds to the selected at least one diagnostic command.

14. The method of claim 13, further comprising:
performing the diagnostics test operation associated with the received at least one RDDI.

15. The method of claim 14, further comprising:
generating diagnostics test result information corresponding to the performed diagnostic test operation associated with the received at least one RDDI; and
communicating the diagnostics test result information to the diagnostic test device.

16. The method of claim 13, further comprising:
receiving an identifier with the establishment of the communication link, wherein the identifier identifies the diagnostic test device as authorized to perform diagnostics on the electronic DUT.

17. The method of claim 16, further comprising:
selecting a first set of diagnostic commands from the plurality of diagnostic commands, wherein the first set of diagnostic commands correspond to diagnostics that the diagnostic test device is authorized to perform, and wherein only RDDIs corresponding to the first set of diagnostic commands are communicated to the diagnostic test device.

18. The method of claim 13, further comprising:
communicating a plurality of diagnostic categories from the electronic DUT to the diagnostic test device, wherein each diagnostic category identifies related diagnostic commands that are operable to diagnose a particular component, feature or function of interest of the electronic DUT.

19. The method of claim 13, further comprising:
receiving an identifier with the at least one RDDI, wherein the identifier identifies the diagnostic test device as authorized to perform diagnostics on the electronic DUT.

20. An electronic device under test (DUT) that receives at least one return diagnostic device instruction (RDDI) from a diagnostic test device, wherein the RDDI corresponds to a diagnostic device instruction (DDI) announced by the electronic DUT, comprising:

an interface operable to communicatively couple the electronic DUT to the diagnostic test device and operable to receive the at least one RDDI from the diagnostic test device;

a memory that stores a plurality of diagnostic commands that are each configured to cause the electronic DUT to perform at least one diagnostics operation associated with the at least one RDDI, wherein each diagnostic command includes a corresponding DDI and DDI description, wherein the DDI description is a textual description that describes a diagnostic test operation that the electronic DUT will perform in response to receiving an associated return device diagnostic instruction (RDDI), and wherein the RDDI corresponds to the device diagnostic instruction that is specific to the electronic DUT and that, when returned to and received by the electronic DUT, causes the electronic DUT to perform the diagnostic test operation described by the associated textual description of the diagnostic test operation in the DDI description; and a processor system communicatively coupled to the interface and the memory, and operable to:
select a first plurality of diagnostic commands, wherein the selected first plurality of diagnostic commands are communicated to the diagnostic test device via the interface; and perform the at least one diagnostics operation in accordance with the at least one RDDI.

* * * * *